United States Patent

Milton

(10) Patent No.: US 11,188,114 B2
(45) Date of Patent: Nov. 30, 2021

(54) DIGITAL CIRCUIT TO DETECT PRESENCE AND QUALITY OF AN EXTERNAL TIMING DEVICE

(71) Applicant: VIAVI SOLUTIONS INC., San Jose, CA (US)

(72) Inventor: Jonathan Paul Milton, St Albans (GB)

(73) Assignee: VIAVI SOLUTIONS INC., San Jose, CA (US)

( * ) Notice: Subject to any disclaimer, the term of this patent is extended or adjusted under 35 U.S.C. 154(b) by 117 days.

(21) Appl. No.: 16/537,073

(22) Filed: Aug. 9, 2019

(65) Prior Publication Data

US 2021/0041905 A1 Feb. 11, 2021

Related U.S. Application Data

(60) Provisional application No. 62/883,473, filed on Aug. 6, 2019.

(51) Int. Cl.

| | |
|---|---|
| *G06F 3/00* | (2006.01) |
| *G06F 1/02* | (2006.01) |
| *G06F 15/76* | (2006.01) |
| *G06F 1/04* | (2006.01) |
| *G06F 7/60* | (2006.01) |
| *G06F 7/544* | (2006.01) |

(52) U.S. Cl.
CPC .............. *G06F 1/022* (2013.01); *G06F 1/04* (2013.01); *G06F 7/544* (2013.01); *G06F 7/607* (2013.01); *G06F 15/76* (2013.01)

(58) Field of Classification Search
None
See application file for complete search history.

(56) References Cited

U.S. PATENT DOCUMENTS

| | | | | |
|---|---|---|---|---|
| 4,617,520 A | * | 10/1986 | Levine | .................. H03K 23/662 327/12 |
| 2002/0079917 A1 | * | 6/2002 | Ohtaki | .................. G01R 31/319 324/762.02 |

* cited by examiner

*Primary Examiner* — Henry Tsai
*Assistant Examiner* — Dean Phan
(74) *Attorney, Agent, or Firm* — Mannava & Kang, P.C.

(57) ABSTRACT

A system for determine presence or quality of an external timing device is provided. The system may include a circuit (e.g., in a field-programmable gate array (FPGA)) having an input, an oscillator, an edge detector, a bit counter, and a calculator element. In some examples, the input may receive an input signal under test. The oscillator may advance a timer at a known rate to facilitate generation of clock samples for the input signal under test. The edge detector may measure edges of the input signal under test based on the clock samples. The circuit may include at least one bit counter to store a count associated with the measured edges for a shorter interval timer period and a longer interval timer period. The calculator element may determine presence or quality of an external timing device based on the count.

17 Claims, 3 Drawing Sheets

DIGITAL CIRCUIT TO DETECT PRESENCE AND QUALITY OF AN EXTERNAL TIMING DEVICE

PRIORITY

This patent application claims priority to U.S. Provisional Patent Application No. 62/883,473, entitled "Digital Circuit to Detect Presence and Quality of an External Timing Device," which was filed on Aug. 6, 2019.

TECHNICAL FIELD

This patent application is directed to test and measurement instrumentation for telecommunication networks, and more specifically, to systems and methods for detecting presence and quality of an external timing device connected to a field-programmable gate array (FPGA) using a digital circuit.

BACKGROUND

An external timing device, such as a clock, is typically used in test and measurement equipment for telecommunication systems to provide synchronization among various components to aid interoperation. However, there are a few technical issues associated with the use of an external timing device. First, the external timing device, when connected to the test and measurement equipment, may produce an incorrect frequency (or electrical levels), or may not be driven at all. Second, the external timing device may not be properly detected by the test and measurement equipment because the external timing device is not connected properly, switched off, misconfigured, or its signals drowned out by noise.

Providing timely feedback, with reward to the presence and quality of an external timing device, to a user or operator may help eliminate potentially confusing or erroneous test results associated with undetected clocks or low-quality timing signals. Conventional solutions for clock identification employ techniques associated with counting edges within a defined time period. In this way, an estimate of a clock input frequency may be produced. However, these traditional approaches tend to average out Gaussian noise, which leads to false detection of a clock even when an input timing frequency signal is undriven.

BRIEF DESCRIPTION OF DRAWINGS

Features of the present disclosure are illustrated by way of example and not limited in the following Figure(s), in which like numerals indicate like elements, in which.

DETAILED DESCRIPTION

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

As described above, an external timing device, such as a clock, is typically used in test and measurement equipment for telecommunication systems to provide synchronization among various components to aid interoperation. However, there are several errors that continue to persist in the use of external timing devices. For example, such a device may at times produce an incorrect frequency (or electrical levels), or may not be driven at all. In other scenarios, the external timing device may not be properly detected by the test and measurement equipment because the external timing device is not connected properly, switched off, misconfigured, or its signals drowned out by noise. Providing timely feedback, with regards to the presence and quality of an external timing device, to a user or operator by a test and measurement device may help eliminate potentially confusing or erroneous test results associated with undetected clocks or low-quality signals.

Accordingly, a system that uses a digital circuit for detecting presence and quality of an external timing device, according to the examples set forth herein, may be provided. The digital circuit may determine whether a clock input to a field-programmable gate array (FPGA), for example, is being driven or is left undriven without requiring any change to external circuitry. The system may also reduce probability of false detection of a valid external timing device when an input is undriven by avoiding implicit averaging out of noise commonly found in conventional solutions and techniques. The system, when implemented within an FPGA, then, may therefore obviate a need to modify existing hardware typically required to reduce noise or chatter associated with undriven inputs. Ultimately, the systems and methods described herein may provide a more efficient, cost-effective, market-ready solution for detecting presence and quality of an external timing device.

Figure 1:
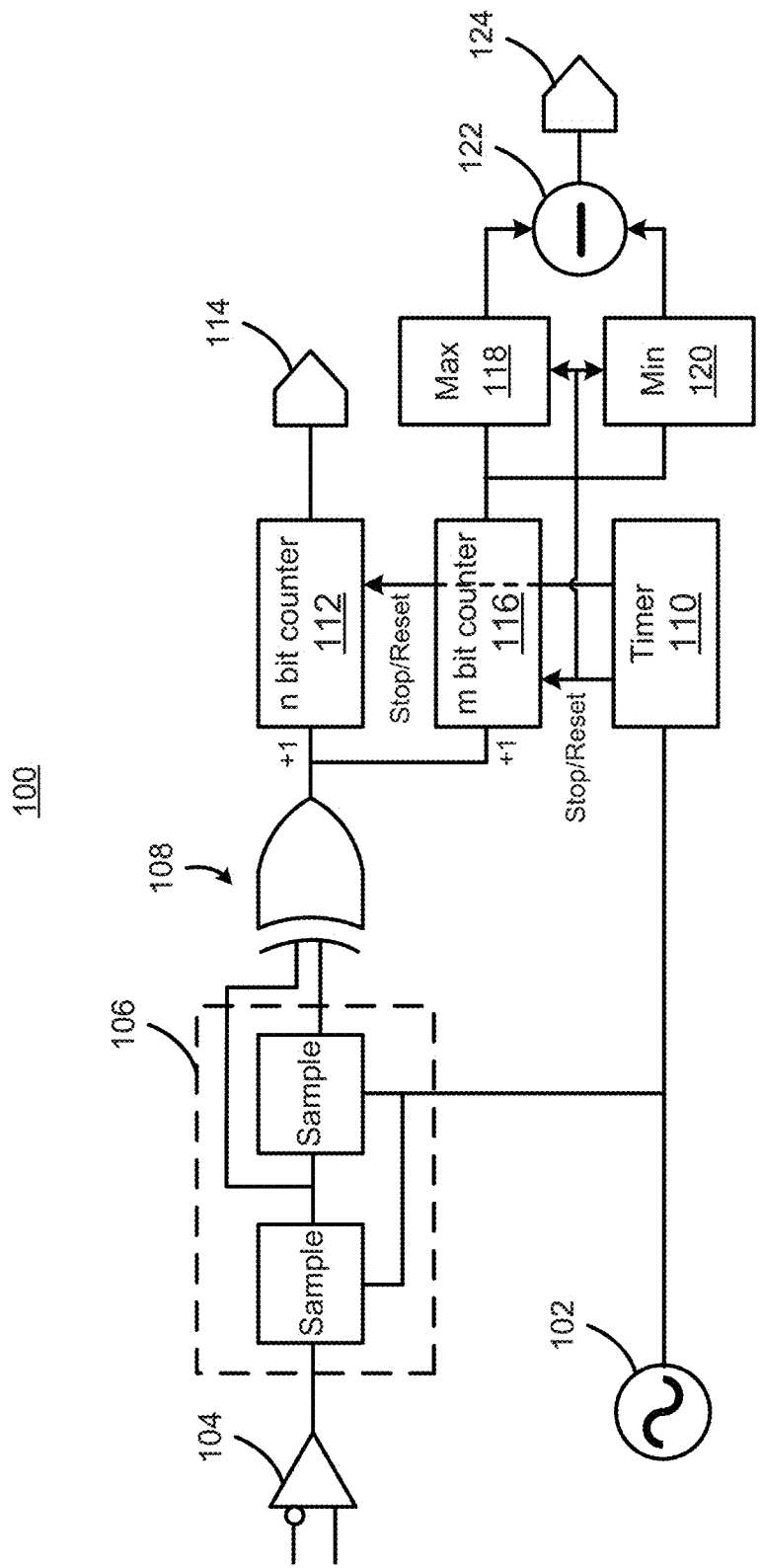
FIG. 1 illustrates a block diagram of a digital circuit for detecting presence and quality of an external timing device, according to an example.

FIG. 1 illustrates a block diagram of a digital circuit 100 for detecting presence and quality of an external timing device, according to an example. As described above, reliably detecting presence and quality of an external timing device, such as a clock, may be important for any type of test and measurement device. In some examples, the digital circuit 100 may be a clock detection circuit and may be incorporated as part of a field-programmable gate array (FPGA) or other processing device. The digital circuit 100 may include a variety of components, including, but not limited to, an oscillator 102, an input 104, any number of clock samples 106, an edge detector 108, a timer 110, an n bit binary counter 112, an estimated period output 114, an m bit binary counter 116, a maximum count 118, a minimum count 120, a subtractor 122, and an estimated variance output 124.

In some examples, the oscillator 102 may be an internal oscillator that generates a periodic, oscillating electric signal, typically as sine or square waves. The oscillator 102 may provide a signals broadcast by radio or television transmitters, clock signals, and/or sounds. In some examples, the signals provided by the oscillator 102 may be of a known frequency. It should be appreciated that the oscillator 102 may include any number of types of oscillators, including harmonic oscillators, linear oscillators, feedback oscillators, negative-resistance oscillators, relaxation oscillators, voltage-controlled oscillators (VCOs), or other similar device.

The input 104 may propagate any number of input signals or data. In some examples, the input 104 may receive an input buffer, which may be undriven or driven signal by a clock waveform. It should be appreciated that in electronic and digital circuitry, a clock waveform may be any type of signal that oscillates between a high and a low state is used like a metronome to coordinate actions of a digital circuit. The input buffer receive at the input 104 may be produced by a clock generator at an external timing device.

It should also be appreciated that circuits using a clock waveform for synchronization may become active at either a rising edge, falling edge, or, in a case of double data rate, both in the rising and in the falling edges of a clock cycle. As described above and herein, a clock waveform may be used to synchronize different components to aid in interoperation. This may be achieved by collecting various clock samples 106 and measuring the rising and/or falling edges using an edge detector 108, as shown.

A signal edge may be defined as the transition of the signal from a high state to a low state or vice-versa. Depending on the type of transition, there may be three different types of edge detection, such as rising edge detection, falling edge detection, and/or either edge detection. In rising edge detection, the input signal may transition from a low state (e.g. 0) to a high state (e.g. 1). In falling edge detection, the input signal may transition from a high state (e.g. 1) to a low state (e.g. 0). In either edge detection, the input signal may be changing in state, from high to low or from low to high. The edge detector 108 may use any of these, or other, detection techniques for signal edge detection, which again may be useful for timers, counters or clock resets, for signal state updates or for triggering a set of functions/algorithms, or the examples described herein.

As integrated circuits become more and more complex, reliably supplying an accurate and synchronized clocks to all components of a circuit becomes increasingly challenging. As a result, the systems and methods described herein may be particular beneficial in various test and measurement equipment for telecommunication networks.

The oscillator 102 and the timer 110 may function in concert to collect the clock samples 106 for edge detection at the edge detector 108. In some examples, the timer 110 may be an internal timer to provision long/short timing signals.

As edge detection is performed, the results may be transmitted to an n bit binary counter 112, where "n" may represent an integer equal to or greater than one. It should be appreciated that in digital logic and computing, the n bit binary counter 112 may be any counter device that may store (or display) any number of times a particular event or process has taken place, often in relationship to a clock signal. The n bit binary counter 112 may include any number of different types of counters, some of which may include, but not limited to, an asynchronous counter, a ripple counter, a synchronous counter, a decade counter, an up/down counter, a ring counter, a cascaded counter, a modulus counter, a Johnson or twisted ring counter, or other counter. The n bit binary counter 112 may be a separate integrated circuit or may be incorporated in the digital circuit 100, as shown in FIG. 1.

In some examples, the n bit binary counter 112 may provide an estimated period output 114. It should be appreciated that at this point, clock presence may be detected. In summary, the input signal may be applied to the input buffer 104, which in some scenarios may act as a limiting amplifier with square wave output of unknown spectrum. This input buffer 104 may be sampled and edge detected. In some examples, when an edge is detected (e.g., a rising edge is detected), the n bit binary counter 112 may be incremented. Here, the oscillator 102 may advance the timer 110, for example, at a known rate. When the timer expires, results of the n bit binary counter 112 may be captured as an estimated mean period output 112 of the input signal. In some examples, a determination of mean period given the number of edges counted N and the time T over which the is made may be expressed as follows:

$$\overline{\text{period}} = \frac{T}{N}$$

Figure 2:
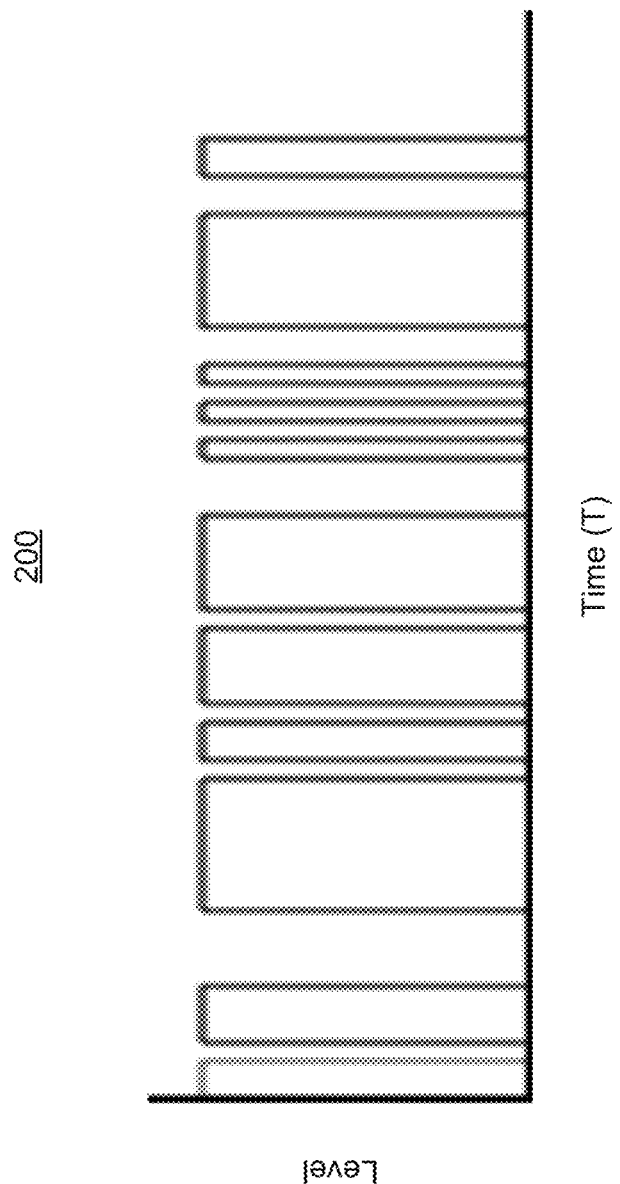
FIG. 2 illustrates a graph of electrical signals associated with an undriven input buffer, according to an example.

FIG. 2 illustrates a graph 200 of electrical signals associated with an undriven input buffer, according to an example. In scenarios where the input may not be driven, as shown, and electrical levels are such that the input buffer may be toggling randomly, the spectrum of samples may be broad and may not reflect any particular signal pattern. Nevertheless, the n bit binary counter 112 may continue to advance, and at the end of the timed interval, an estimate of period 114 may still be provided. The reason for this is that, in practice, electrical noise present on the input may include very weak components at the desired frequency which may cause a false detection in the event other noise components average to zero.

Given that the signal under test may be asynchronous to the oscillator 102 (functioning as a reference clock), the edge count N during the time period T may vary by 0 or 1, depending on how the sampling resolves metastability or other related issue. In the absence of other noise, then, this may give rise to a range of estimated clock period, as expressed by the following:

$$\frac{T}{N} \geq \overline{\text{period}} \geq \frac{T}{N+1}$$

In other words, this may imply that an estimation error may be inversely proportional to the time period T, which may be expressed as follows:

$$\max(F_{err}) = \frac{1}{T}$$

Thus, if it is assumed that the clock signal being monitored is subject to Gaussian distributed phase noise (e.g., random jitter), then the estimated mean period 114 may also include an error term. In this case, the set of clock edges used to generate the estimated mean may be a sample of a set of clock edges (potentially infinite set of clock edges) of the signal under test. The estimated mean may then be the mean of this sample set, and may be itself a sampled variable. More specifically, it should be appreciated that the distribution of estimated means may have a normal distribution, with a center co-incident with that of the underlying population, and a standard deviation inversely proportional to a square root of the sample size. Thus, noise embedded in the sample set may diminish as the number of samples N increases, as shown in the expression below:

$$\sigma_M = \frac{\sigma}{\sqrt{N}},$$

where σ represents noise in the input signal under test and $\sigma_M$ represents noise in the estimated mean.

Although this may be a useful property when the signal under test is driven, when the signal under test is undriven and detecting the presence of noise is desired, this property may often lead to false detection of a signal when in fact there is none. In practice, the n bit counter 112 may be averaging away this noise on the input and finding low level spurs in the background noise which suddenly appear to be a valid clock.

Therefore, the expressions above may demonstrate a fundamental trade-off of this approach to signal detection. While there may be high accuracy and the ability to discriminate precise input frequencies, at times, this may require as long as a time period as possible. However, increasing the time period consequently means increasing the number of samples captured, and reducing noise seen by the detector, potentially leading to false detection when the signal is undriven or weak.

Accordingly, the systems and methods described herein may obviate these issues. Referring back to FIG. 1, the digital circuit may include an m bit binary counter 116, a maximum count 118, a minimum count 120, a subtractor 122, and an estimated variance output 124 to help detect noise on the input, which is indicative of it being undriven. These components, among others, may help eliminate the trade-off mentioned above and allow the timer 110 to be optimized for accurate frequency estimation, as well as reliable detection of an undriven input.

The m bit binary counter 116 may be similar to the n bit binary counter 112, where "m" also represents an integer equal to or greater than one. The m bit binary counter 116, however, is communicatively coupled to a maximum count 118 and a minimum count 120, and by using a subtractor 122, an estimated variance output 124 may be provided to help detect noise at the input.

More specifically, in order to estimate the level of noise, the timer 110 may be modified to measure a shorter interval, in addition to the longer interval already described above. It should be appreciated that the timer 110 measuring the shorter interval may be achieved at no additional cost by tapping lower order bits from the timer.

When an edge on the input signal is detected by the edge detector 108, the m bit binary counter 116 (for shorter interval) may also advance. In other words, when the shorter interval expires in the timer 110, the result in the m bit binary counter 116 may be captured and a running maximum 118 and/or running minimum 120 may be updated as appropriate. When the longer timer interval expires in the timer 110, the difference between the running maximum 118 and/or the running minimum 120 may then be computed, for example, by the subtractor 122. The subtractor 122 may then generate results that reflect a variance in the sampled signal.

It should be appreciated that each iteration of the shorter time interval and its associated count at the m bit binary counter 116 may be an estimate of the mean of the period of the input. The noise embedded in this estimate may be similar to what has been described above, but by virtue of the shorter time interval, noise will not be greatly diminished. In essence, this shortened count may be a deliberately noisy estimate of the mean period of the signal.

In this way, the ratio of the longer interval to the shorter interval may help determine a number of such estimates made. In some examples, there may be 256 such iterations that are used. Due to the noise, there may be significant variance from one estimate to the next, which may be reflected in a difference between the maximum 118 and minimum 120 counts. When a final long interval expires at the timer 110, the difference between the maximum 118 and minimum 120 counts may be calculated, and this calculation may represent the noisiness of the input signal. Thus, if a valid clock is applied, then this final calculation value may be closer to or equal to zero. If the input is undriven, the count may be high. Accordingly, a simple threshold may be applied to make a final decision on noise.

While examples described herein are directed to configurations as shown, it should be appreciated that any of the components described herein may be altered, changed, replaced, or modified, in size, shape, and numbers, or material, depending on application or use case, and adjusted for desired or external timing device detection.

Figure 3:
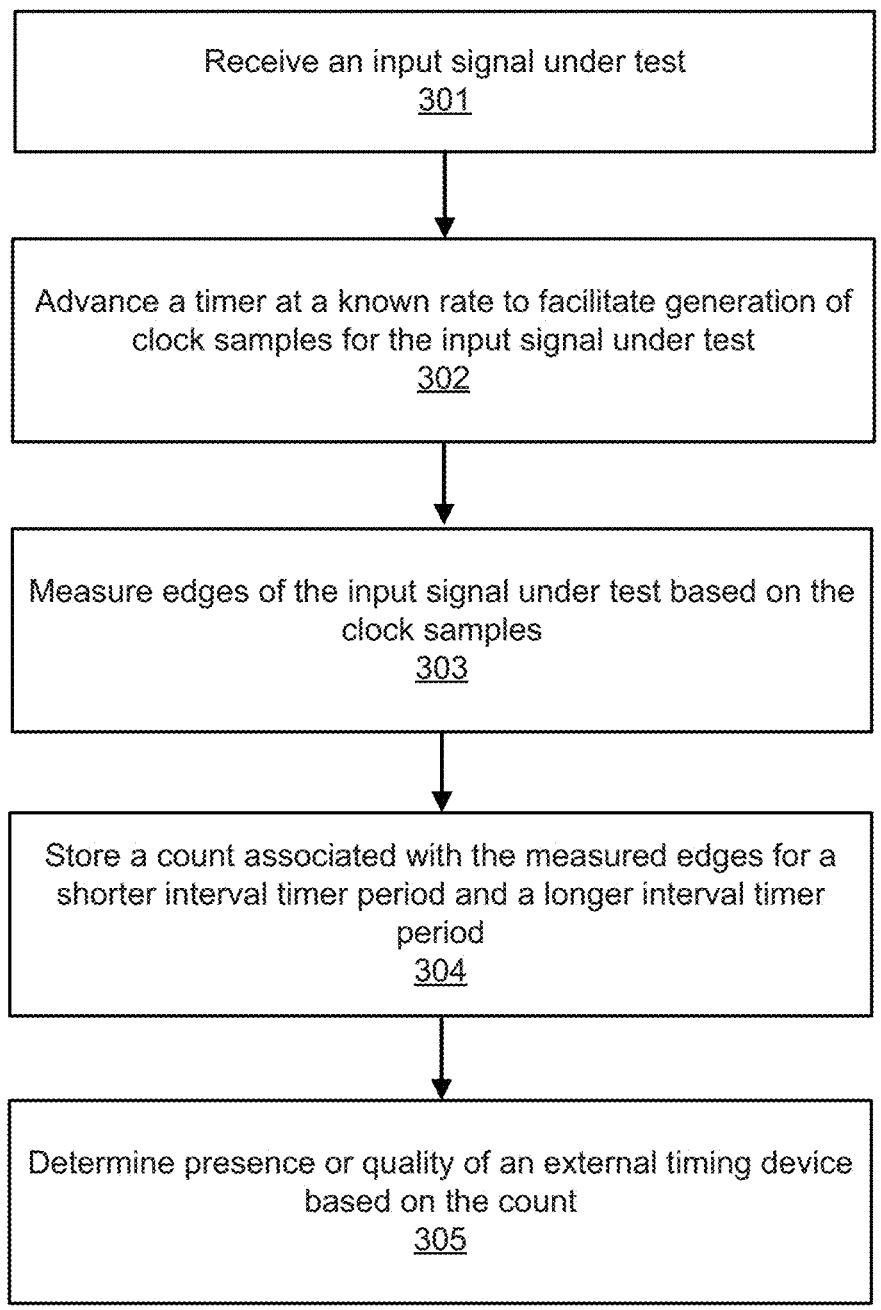
FIG. 3 illustrates a flow chart of a method for detecting presence and quality of an external timing device, according to an example.

FIG. 3 illustrates a flow chart of a method for detecting presence and quality of an external timing device, according to an example. The method 300 is provided by way of example, as there may be a variety of ways to carry out the method described herein. Although the method 300 is primarily described as being performed by the systems in configurations 100 of FIG. 1, the method 300 may be executed or otherwise performed by one or more processing components of another system or a combination of systems. Each block shown in FIG. 3 may further represent one or more processes, methods, or subroutines, and one or more of the blocks may include machine readable instructions stored on a non-transitory computer readable medium and executed by a processor or other type of processing circuit to perform one or more operations described herein.

At block 301, an input (e.g., input 104) may be provided to receive an input signal under test. In some examples, the input signal under test is undriven or driven by a clock waveform, as described herein.

At block 302, an oscillator (e.g., oscillator 102) may be provided to advance a timer (e.g., timer 110) at a known rate. In some examples, the oscillator 102 may help facilitate generation of clock samples 106 for the input signal under test.

At block 303, an edge detector (e.g., edge detector 108) may be provided to measure edges of the input signal under test. The edges may be measured based on the clock samples. For example, the edge detector may use rising edge detection, falling edge detection, or either edge detection, as described herein, or any other edge detection technique.

At block 304, a bit counter (e.g., m bit binary counter 116) may be provided to store or display a count associated with the measured edges. The count may be for a shorter interval timer period and/or a longer interval timer period. In some examples, the count may include a maximum count 118 and a minimum count 120 for each of the shorter interval timer period and the longer interval timer period.

At block 305, a calculator element may be provided to determine presence or quality of an external timing device based on the count. As described above, the calculator element is a subtractor 122. The subtractor 122 may determine difference values (or variance) between the maximum count 118 and the minimum count 120 for each of the shorter interval timer period and the longer interval timer period. This information may allow the subtractor 122 to determine a noise estimate of the mean period of the input signal under test, which may be achieved, for example, by comparing the determined difference values against a predetermined threshold, as described herein. It should be appreciated that the external timing device may be determined to be present or of high quality in the event the determined difference values do not exceed the predetermined threshold. Alternatively or additionally, the external timing device may be determined to be absent or of low quality in the event the determined difference values exceed the predetermined threshold. It should be appreciated that the predetermined threshold may be programmable or customizable based on a variety of other factors and configurations and/or by a user or operator.

It should be appreciated that the systems and methods described herein may facilitate more reliable detection of an external timing device. It should also be appreciated that the systems and methods, as described herein, may also include or communicate with other components not shown. For example, these may include external processors, counters, analyzers, computing devices, and other measuring devices or systems. This may also include middleware (not shown) as well. The middleware may include software hosted by one or more servers or devices. Furthermore, it should be appreciated that some of the middleware or servers may or may not be needed to achieve functionality. Other types of servers, middleware, systems, platforms, and applications not shown may also be provided at the back-end to facilitate the features and functionalities of the testing and measurement system.

Moreover, single components may be provided as multiple components, and vice versa, to perform the functions and features described herein. It should be appreciated that the components of the system described herein may operate in partial or full capacity, or it may be removed entirely. It should also be appreciated that analytics and processing techniques described herein with respect to the detection of a timing device, for example, may also be performed partially or in full by other various components of the overall system.

It should be appreciated that data stores may also be provided to the apparatuses, systems, and methods described herein, and may include volatile and/or nonvolatile data storage that may store data and software or firmware including machine-readable instructions. The software or firmware may include subroutines or applications that perform the functions of the measurement system and/or run one or more application that utilize data from the measurement or other communicatively coupled system.

The various components, circuits, elements, components, and interfaces, may be any number of mechanical, electrical, hardware, network, or software components, circuits, elements, and interfaces that serves to facilitate communication, exchange, and analysis data between any number of or combination of equipment, protocol layers, or applications. For example, the components described herein may each include a network or communication interface to communicate with other servers, devices, components or network elements via a network or other communication protocol.

Although examples are directed to test and measurement systems, it should be appreciated that the systems and methods described herein may also be used in other various systems and other implementations. For example, there may be numerous applications in optical, digital, or analog communication networks and fiber sensor systems that could employ the systems and methods as well, or any other timing-based systems that rely and accurate clock or timing mechanisms. It should be appreciated that the systems and methods described herein may also be used to help provide, directly or indirectly, measurements for distance, angle, rotation, speed, position, wavelength, transmissivity, and other related measurements that may be inferred based on timing measurements.

It should also be appreciated that the systems and methods described herein may not only optimize reliability of external timing device detection, but also introduce a low-cost, unintrusive way to detect an external timing device using currently systems and components without additional hardware add-ons. Furthermore, additional customizations and flexibility using the systems and methods described herein may also be provided beyond FPGA implementation. For example, the systems and methods described herein may be employed in other various computing environments and components, such as semiconductor-based microprocessor, a central processing unit (CPU), an application specific integrated circuit (ASIC), and/or other suitable hardware device. In some examples, the memory described herein may have stored thereon machine readable instructions that any processing component may execute. These may include any number of electronic, magnetic, optical, or other physical storage device that contains or stores executable instructions. The memory may be, for example, Random Access memory (RAM), an Electrically Erasable Programmable Read-Only Memory (EEPROM), a storage device, an optical disc, and the like. The memory, which may also be referred to as a computer readable storage medium, may be a non-transitory machine-readable storage medium, where the term "non-transitory" does not encompass transitory propagating signals.

With additional advantages that include reducing probability of false detection of a valid clock, especially in situations when input is undriven, but avoiding implicit averaging out of noise as is common in traditional solutions. Furthermore, the systems and methods, when implemented in a processing device (e.g., FPGA), may obviate any additional need to modify hardware to reduce related "chatter" on undriven inputs. Ultimately, the systems and methods described herein may provide a more efficient, cost-effective, market-ready solution for detecting presence and quality of an external timing device.

What has been described and illustrated herein are examples of the disclosure along with some variations. The terms, descriptions, and figures used herein are set forth by way of illustration only and are not meant as limitations. Many variations are possible within the scope of the disclosure, which is intended to be defined by the following claims—and their equivalents—in which all terms are meant in their broadest reasonable sense unless otherwise indicated.

The invention claimed is:

1. A circuit, comprising:
an input to receive an input signal under test;
an oscillator to advance a timer at a known rate to facilitate generation of clock samples for the input signal under test
an edge detector to measure edges of the input signal under test based on the clock samples;
a bit counter to store a count associated with the measured edges for a shorter interval timer period and a longer interval timer period, wherein the count comprises a maximum count and a minimum count for each of the shorter interval timer period and the longer interval timer period; and a calculator element to determine presence or quality of an external timing device based on the count.

2. The circuit of claim 1, wherein the input signal under test is undriven or driven by a clock waveform.

3. The circuit of claim 1, wherein the calculator element is a subtractor to determine difference values between the maximum count and the minimum count for each of the shorter interval timer period and the longer interval timer period.

4. The circuit of claim 3, wherein the subtractor determines a noise estimate of a mean period of the input signal under test by comparing the determined difference values against a predetermined threshold.

5. The circuit of claim 4, wherein the noise estimate is based on a distribution of means in accordance with the following expression:

$$\sigma_M = \frac{\sigma}{\sqrt{N}},$$

where $\sigma$ represents noise in the input signal under test, $\sigma_M$ represents noise in an estimated mean, and N represents a number of clock samples.

6. The circuit of claim 4, wherein the external timing device is present or of high quality in an event the determined difference values do not exceed the predetermined threshold, and wherein the external timing device is not present or of low quality in an event the determined difference values exceed the predetermined threshold.

7. A method for detecting an external timing device, comprising:
receiving, at an input, an input signal under test;
advancing, via an oscillator, a timer at a known rate to facilitate generation of clock samples for the input signal under test
measure, by an edge detector, edges of the input signal under test based on the clock samples;
storing, by a bit counter, a count associated with the measured edges for a shorter interval timer period and a longer interval timer period, wherein the count comprises a maximum count and a minimum count for each of the shorter interval timer period and the longer interval timer period; and
determining, by a calculator element, presence or quality of an external timing device based on the count.

8. The method of claim 7, wherein the input signal under test is undriven or driven by a clock waveform.

9. The method of claim 7, wherein the calculator element is a subtractor to determine difference values between the maximum count and the minimum count for each of the shorter interval timer period and the longer interval timer period.

10. The method of claim 9, wherein the subtractor determines a noise estimate of a mean period of the input signal under test by comparing the determined difference values against a predetermined threshold.

11. The method of claim 10, wherein the noise estimate is based on a distribution of means in accordance with the following expression:

$$\sigma_M = \frac{\sigma}{\sqrt{N}},$$

where $\sigma$ represents noise in the input signal under test, $\sigma_M$ represents noise in an estimated mean, and N represents a number of clock samples.

12. The method of claim 10, wherein the external timing device is present or of high quality in an event the determined difference values do not exceed the predetermined threshold, and wherein the external timing device is not present or of low quality in an event the determined difference values exceed the predetermined threshold.

13. A non-transitory computer-readable storage medium having an executable stored thereon, which when executed instructs a processor to:
receive an input signal under test;
advance a timer at a known rate to facilitate generation of clock samples for the input signal under test
measure edges of the input signal under test based on the clock samples; store a count associated with the measured edges for a shorter interval timer period and a longer interval timer period, wherein the count comprises a maximum count and a minimum count for each of the shorter interval timer period and the longer interval timer period; and
determine presence or quality of an external timing device based on the count.

14. The non-transitory computer-readable storage medium of claim 13, wherein determining presence or quality of an external timing device is based on calculating difference values between the maximum count and the minimum count for each of the shorter interval timer period and the longer interval timer period.

15. The non-transitory computer-readable storage medium of claim 14, further comprising:
determining a noise estimate of a mean period of the input signal under test by comparing the calculated difference values against a predetermined threshold.

16. The non-transitory computer-readable storage medium of claim 15, wherein the noise estimate is based on a distribution of means in accordance with the following expression:

$$\sigma_M = \frac{\sigma}{\sqrt{N}},$$

where $\sigma$ represents noise in the input signal under test, $\sigma_M$ represents noise in an estimated mean, and N represents a number of clock samples.

17. The non-transitory computer-readable storage medium of claim 15, wherein the external timing device is present or of high quality in an event the calculated difference values do not exceed the predetermined threshold, and wherein the external timing device is not present or of low quality in an event the calculated difference values exceed the predetermined threshold.

* * * * *